United States Patent
Kang et al.

(10) Patent No.: US 9,900,991 B2
(45) Date of Patent: Feb. 20, 2018

(54) FLEXIBLE PRINTED CIRCUIT BOARD FOR OPTICAL MODULE

(71) Applicant: ELECTRONICS AND TELECOMMUNICATIONS RESEARCH INSTITUTE, Daejeon (KR)

(72) Inventors: Sae Kyoung Kang, Daejeon-si (KR); Heuk Park, Daejeon-si (KR); Hwan Seok Chung, Daejeon-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/263,498

(22) Filed: Sep. 13, 2016

(65) Prior Publication Data

US 2017/0086300 A1     Mar. 23, 2017

(30) Foreign Application Priority Data

Sep. 17, 2015   (KR) .................. 10-2015-0131888

(51) Int. Cl.
*H05K 1/00*   (2006.01)
*H05K 1/18*   (2006.01)
*H05K 1/02*   (2006.01)
*H05K 1/11*   (2006.01)
*H05K 3/28*   (2006.01)
*H05K 3/34*   (2006.01)

(52) U.S. Cl.
CPC ............ *H05K 1/189* (2013.01); *H05K 1/025* (2013.01); *H05K 1/116* (2013.01); *H05K 3/28* (2013.01); *H05K 3/3447* (2013.01); *H05K 2201/10121* (2013.01)

(58) Field of Classification Search
CPC . H05K 1/02; H05K 1/11; H01R 12/00; H01R 12/16; H01R 13/00; H01R 13/646; H01R 13/719
USPC .............. 174/254, 51, 255, 262; 439/65, 82, 439/620.14
See application file for complete search history.

(56) References Cited

U.S. PATENT DOCUMENTS 5,832,596 A * 11/1998 Chiu ................. H01L 23/49811
                                                257/E23.062
6,276,945 B1 *  8/2001 Hayward ........... H01R 13/6589
                                                439/82
6,903,687 B1 *  6/2005 Fink .................... H01Q 9/0407
                                                333/126

(Continued)

OTHER PUBLICATIONS

Takuma Ban et al., "25-Gbps receiver for 100-Gbps Ethernet employing costeffective small coaxial package", ECOC 2008, We.1.C.6 (vol. 3-35), pp. 1-2, 2008.

*Primary Examiner* — Xiaoliang Chen
(74) *Attorney, Agent, or Firm* — LRK Patent Law Firm

(57) ABSTRACT

A flexible printed circuit board (FPCB) for an optical module includes: a signal via pad connected with a signal lead pin of the optical module; a ground layer spaced apart from the signal via pad; an isolation gap formed between the signal via pad and the ground layer; and a protective layer which is formed at a portion that comprises the isolation gap, and which, when connected with the signal via pad, compensates for parasitic inductance caused by a protruding signal lead pin.

10 Claims, 8 Drawing Sheets

(56) References Cited

U.S. PATENT DOCUMENTS

| | | | | |
|---|---|---|---|---|
| 8,143,526 B2* | 3/2012 | Hsu | ............... | H05K 1/0245 |
| | | | | 174/254 |
| 2002/0151220 A1* | 10/2002 | Dingenotto | ........ | H01R 13/7195 |
| | | | | 439/620.14 |
| 2009/0123116 A1* | 5/2009 | Tanaka | ............ | G02B 6/4201 |
| | | | | 385/92 |
| 2010/0285676 A1* | 11/2010 | Ikeuchi | ............ | H01R 12/62 |
| | | | | 439/65 |
| 2013/0342280 A1* | 12/2013 | Blanton | ............ | H01P 5/02 |
| | | | | 333/33 |
| 2014/0178069 A1* | 6/2014 | Kim | ............ | H04J 14/0221 |
| | | | | 398/49 |

\* cited by examiner

FLEXIBLE PRINTED CIRCUIT BOARD FOR OPTICAL MODULE

CROSS-REFERENCE TO RELATED APPLICATION(S)

This application claims priority from Korean Patent Application No. 10-2015-0131888, filed on Sep. 17, 2015, in the Korean Intellectual Property Office, the entire disclosure of which is incorporated herein by reference for all purposes.

BACKGROUND

1. Field

The following description relates to a flexible printed circuit board for an optical module used in optical communications.

2. Description of the Related Art

An optical transceiver is a module that receives an electric signal to generate an optical signal, or a module that receives an optical signal and converts the received optical signal into an electric signal. The optical transceiver is positioned at the end of an optical transmission system or a router and serves as an optical interface. Such optical transceiver includes an optical transmission module and an optical reception module, in which with the increased amount of data transmission, the optical transmission module and the optical reception module, which are core components, are becoming faster and smaller. The optical transmission module and the optical reception module may be designed to support both a single wavelength and multi wavelengths depending on applications, and may be configured in a package of various shapes.

SUMMARY

Provided is a flexible printed circuit board for optical modules that may extend an operating bandwidth.

In one general aspect, there is provided a flexible printed circuit board (FPCB) for an optical module, the FPCB including: a signal via pad connected with a signal lead pin of the optical module; a ground layer spaced apart from the signal via pad; an isolation gap formed between the signal via pad and the ground layer; and a protective layer which is formed at a portion that comprises the isolation gap, and which, when connected with the signal via pad, compensates for parasitic inductance caused by a protruding signal lead pin.

The protective layer may induce a capacitance component in the isolation gap to compensate for the parasitic inductance caused by the protruding signal lead pin.

The protective layer may have a higher dielectric constant than air. The protective layer may be a cover layer filled with a coating material. The protective layer may be filled with a dielectric material, and the dielectric material may be a bonding material.

The protective layer may include: a first protective layer formed at a portion that comprises a first isolation gap provided between the signal via pad and a top-side ground layer; and a second protective layer formed at a portion that comprises a second isolation gap provided between the signal via pad and a bottom-side ground layer. The first isolation gap and the second isolation gap may be identical to or different from each other.

The first protective layer may be a first cover layer filled with a first coating material; and the second protective layer may be a second cover layer filled with a second coating material, wherein the first coating material and the second coating material may be identical to or different from each other.

The first protective layer may be filled with a first dielectric material; and the second protective layer is filled with a second dielectric material, wherein the first dielectric material and the second dielectric material may be identical to or different from each other.

In another general aspect, there is provided a flexible printed circuit board (FPCB) for an optical module, the FPCB including: a top-side cover layer formed on the top of the FPCB; a top-side ground layer formed on the bottom of the top-side cover layer; a bottom-side ground layer connected with the top-side ground layer through a ground via; a signal via pad having an upper portion spaced apart from the top-side ground layer, and a lower portion spaced apart from the bottom-side ground layer; a bottom-side cover layer formed on the bottom of the bottom-side ground layer; a first isolation gap formed between the top-side ground layer and the upper portion of the signal via pad; and a second isolation gap formed between the bottom-side ground layer and the lower portion of the signal via pad, wherein either one of the first isolation gap and the second isolation gap is filled with a coating material or a dielectric material.

The first isolation gap may be filled with a same material as the top-side cover layer; and the second isolation gap may be filled with a same material as the bottom-side cover layer. The first isolation gap may be filled with a top-side dielectric material; and the second isolation gap may be filled with a bottom-side dielectric material. The first isolation gap may be filled with air; and the second isolation gap may be filled with the bottom-side dielectric material. The first isolation gap may be filled with a same material as the top-side cover layer; and the second isolation gap may be filled with the bottom-side dielectric material. The first isolation gap may be filled with air; and the second isolation gap may be filled with a same material as the bottom-side cover layer. The first isolation gap may be filled with a same material as the top-side cover layer; and the second isolation gap may be filled with air. The first isolation gap may be filled with the top-side dielectric material; and the second isolation gap may be filled with air.

DETAILED DESCRIPTION

Hereinafter, exemplary embodiments of the present disclosure will be described in detail with reference to the accompanying drawings. In the following description, a detailed description of known functions and configurations incorporated herein will be omitted when it may obscure the subject matter of the present invention. Further, the terms used throughout this specification are defined in consideration of functions according to exemplary embodiments, and can be varied according to a purpose of a user or manager, or precedent and so on. Therefore, definitions of the terms should be made on the basis of the overall context.

Figure 1:
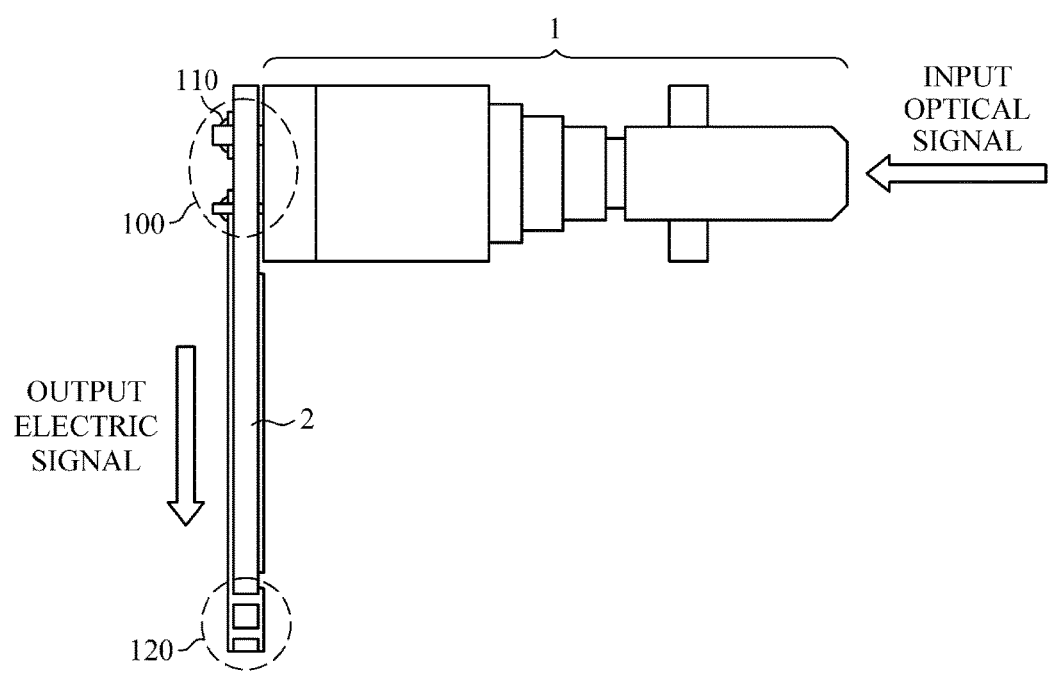
FIG. 1 is a diagram illustrating an optical reception module according to an exemplary embodiment.

FIG. 1 is a diagram illustrating an optical reception module according to an exemplary embodiment.

More specifically, FIG. 1 is a diagram illustrating an optical reception module that is based on a transistor outline (TO) package and may support a single wavelength. An optical transmission module may be configured to have the same shape as the optical reception module. In addition to the TO package, the optical reception module may also have a shape of a box, e.g., a square box.

The optical reception module is largely composed of an optical module 1 and a flexible printed circuit board ("FPCB") 2. The optical module 1 receives an optical signal, converts the received optical signal into an electric signal, and outputs the electric signal. The output electric signal is transmitted to a main PCB board through the FPCB 2. The optical module 1 and the FPCB 2 are connected with each other so that the electric signal is transmitted through a path of 90 degrees, as shown by the reference numeral 100 in FIG. 1, and the optical module 1 and the FPCB 2 are fixed by soldering as shown by the reference numeral 110 in FIG. 1. The reference numeral 120 shows a portion of the FPCB connected to the main PCB board.

Figure 2:
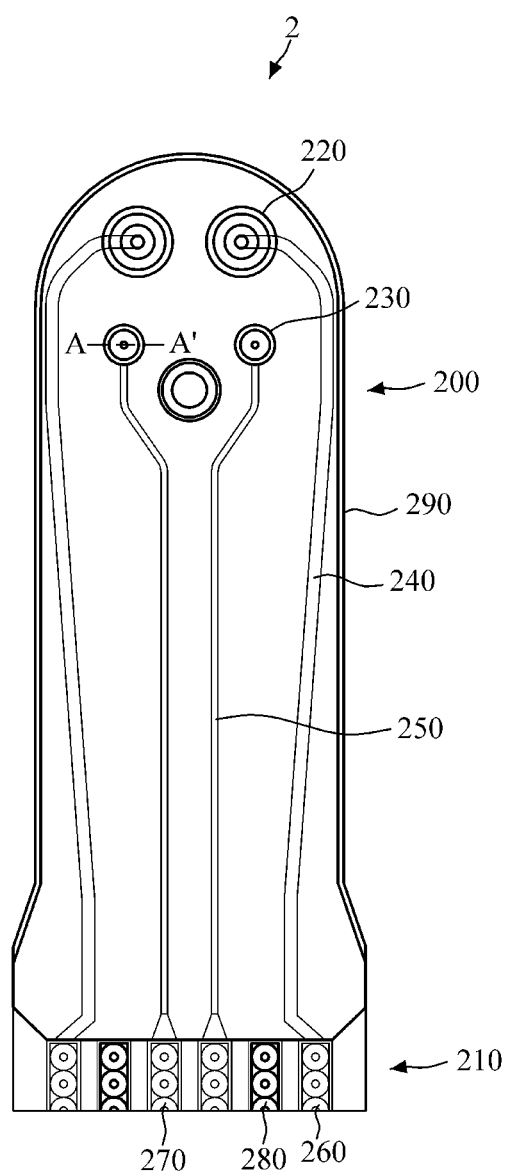
FIG. 2 is a plan view illustrating a flexible printed circuit board ("FPCB") seen from the left of FIG. 1.

FIG. 2 is a plan view illustrating a FPCB seen from the left of FIG. 1.

Referring to FIG. 2, the FPCB 2 may be divided into a portion 200 connected to an optical module and a portion 210 connected to a main PCB board, in which the main PCB board may be a main board in an optical transmission/reception section or an optical transceiver.

A substrate base 290 of the FPCB 2 is flexible enough to be readily bent. A signal via pad 230 includes an upper signal pad and a lower signal pad that are disposed on the same axis, in which the upper signal pad and the lower signal pad may be connected with each other through a signal via. The signal via pad 230 has a through hole formed at a portion corresponding to a signal via. The through hole has a diameter large enough for a signal lead pin to be inserted through the through hole, and is formed to vertically pass through the center of the signal via. With the signal lead pin of the optical module being inserted into the through hole, when the signal lead pin is soldered to the lower signal pad, the signal lead pin is connected to the upper signal pad as well as the lower signal pad through the signal via, and thus is connected to a signal line 250. Although there are two signal via pads 230 in FIG. 2, the number is not limited thereto.

The signal line 250 is disposed on the top of the substrate base 290. The signal line 250 extends from the upper signal pad along a longitudinal direction of the substrate base 290. The signal line 250 may receive a high-speed signal, and may be formed of a conductive material and formed to have a uniform width and thickness. The signal line 250 may be a data signal line for transmitting a data signal. A connection pad 270 connectable to a main PCB board may be disposed at a rear end of the signal line 250.

Driving signal lines 240 for transmitting a power signal or other signals for monitoring/control may be provided on the top of the substrate base 290. A signal pad 220, having the same shape as the signal via pad 230, is disposed at a front end portion of each of the driving signal lines 240, and thus is connected to a driving signal lead pin of the optical communication module. A connection pad 260 connectable to the main PCB board may be disposed at a rear end portion of the driving signal line 240. A ground pad 280 may be interposed between the connection pad 270 connected to the signal line 250 and the connection pad 260 connected to each of the driving signal lines 240.

Hereinafter, the structure of the FPCB taken in line A-A' of FIG. 2 will be described in detail with reference to FIGS. 3 to 6. Referring to FIGS. 3 to 6, by providing an isolation gap between the signal via pad and a ground layer included in the FPCB, and by filling the isolation gap with a protective layer, parasitic inductance caused by the signal lead pin of the optical module may be compensated for.

Figure 3:
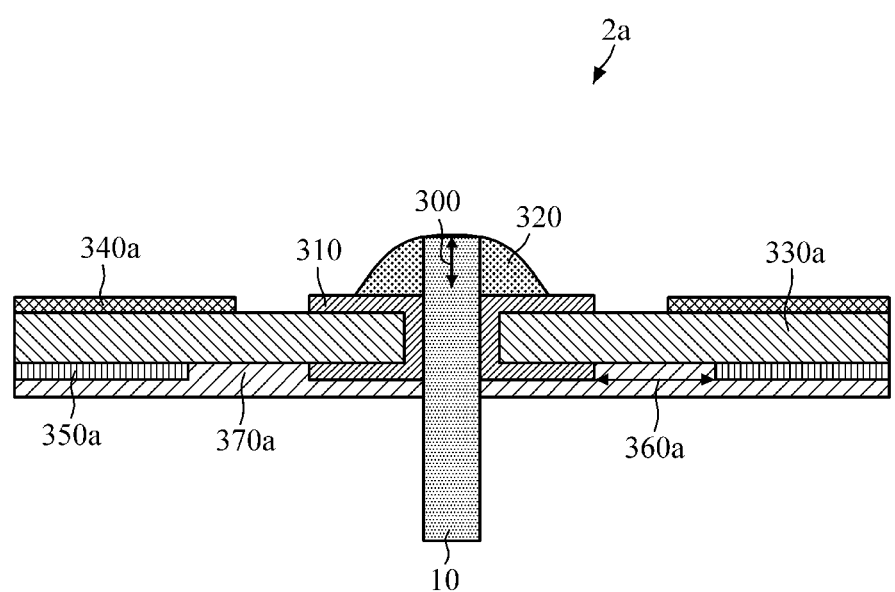
FIG. 3 is a diagram illustrating an FPCB according to a first exemplary embodiment.
Figure 4:
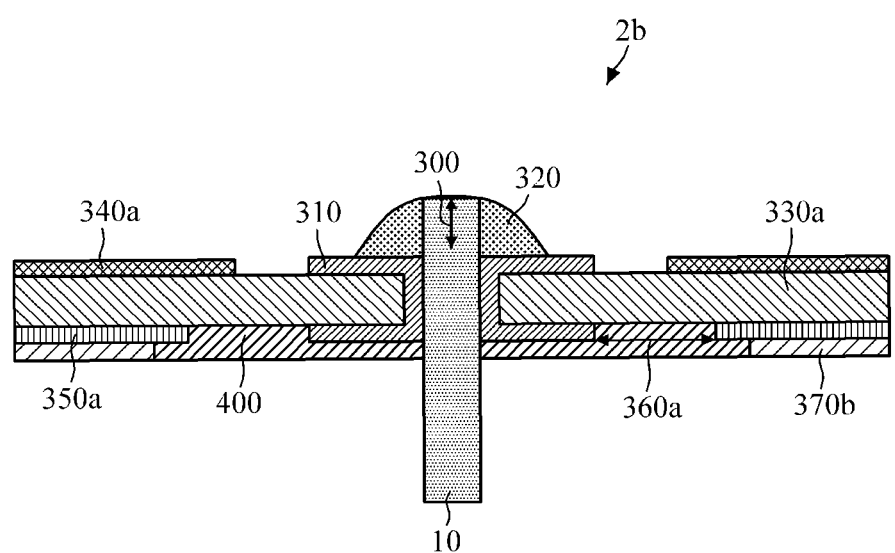
FIG. 4 is a diagram illustrating an FPCB according to a second exemplary embodiment.
Figure 5:
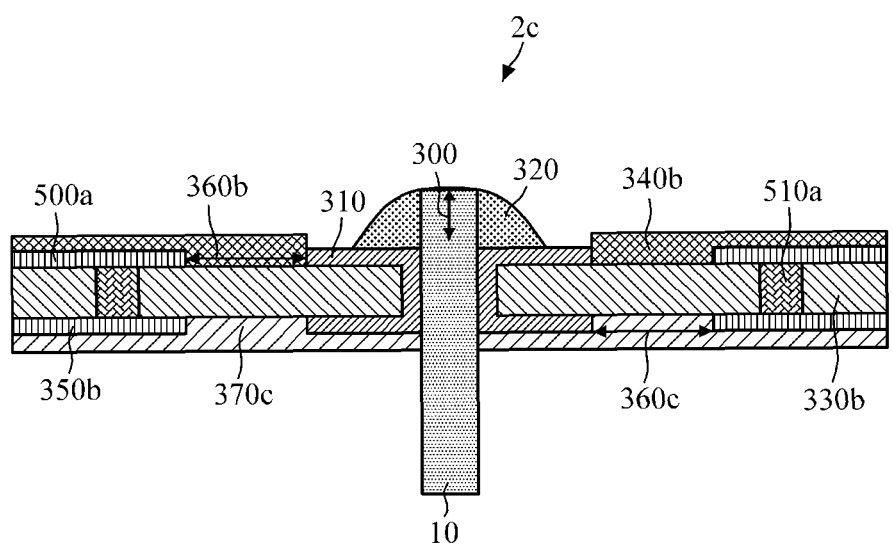
FIG. 5 is a diagram illustrating an FPCB according to a third exemplary embodiment.
Figure 6:
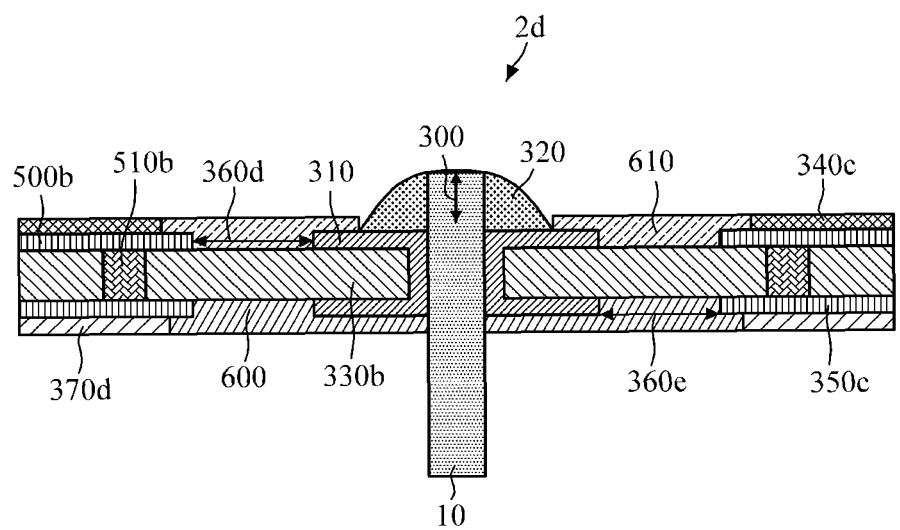
FIG. 6 is a diagram illustrating an FPCB according to a fourth exemplary embodiment.

The protective layer in a first exemplary embodiment may be a bottom-side cover layer 370a as illustrated in FIG. 3. The protective layer in a second exemplary embodiment may include a bottom-side dielectric material 400 as illustrated in FIG. 4. The protective layer in a third exemplary embodiment may include a top-side cover layer 340b and a bottom-side cover layer 370c as illustrated in FIG. 5, in which the top-side cover layer 340b and the bottom-side cover layer 370c may be formed of the same material or different materials. The protective layer in a fourth exemplary embodiment may include a bottom-side dielectric material 600 and a top-side dielectric material 610 as illustrated in FIG. 6.

FIG. 3 is a diagram illustrating an FPCB according to a first exemplary embodiment.

Referring to FIG. 3, the FPCB 2a includes a signal via pad 310, a core layer 330a, a top-side cover layer 340a, a bottom-side ground layer 350a, an isolation gap 360a, and a bottom-side cover layer 370a.

When the signal lead pin 10 of the optical module is inserted through the through hole of the FPCB 2a, the signal lead pin 10 is cut to slightly protrude 300, and is soldered with solder 320 to the signal via pad 310 and to thereby be fixed therewith. In this case, the protruding lead pin 300 unintentionally causes parasitic inductance. In order to compensate for the parasitic inductance, the isolation gap 360a is provided between the bottom-side ground layer 350a and the signal via pad 310, to induce a parasitic capacitance component.

The isolation gap 360a is generally exposed to the air. In this case, due to parasitic capacitance between the signal via pad 310 and the bottom-side ground layer 350a, it is difficult to compensate for a parasitic inductance component resulting from the protruding lead pin 300, thereby limiting a manufacturing process of the FPCB. The isolation gap, which is provided between the bottom-side ground layer 350a and the signal via pad 310 to induce a desired parasitic capacitance component, may be limited depending on conditions of manufacturing the FPCB, and there may be a case where the gap may not be reduced without limitation.

Referring to FIG. 3, the isolation gap 360a, which is provided between the bottom-side ground layer 350a and the signal via pad 310 to induce a desired parasitic capacitance component, is filled with the bottom-side cover layer 370a instead of air. The bottom-side cover layer 370a, having a higher dielectric constant than air, provides protection and electrical insulation, to induce parasitic capacitance. A coating material generally used for the manufacture of the FPCB may be used as the bottom-side cover layer 370a. Bottom-side cover layer 370a covers a bottom side of a lower portion of signal via pad 310 and covers bottom-side ground layer 350a.

The core layer 330a of the FPCB 2a may include a polyimide-based material, a Teflon-based material, a material obtained by combining a polyimide-based material and a Teflon-based material, and a dielectric material having flexibility.

FIG. 4 is a diagram illustrating an FPCB according to a second exemplary embodiment.

Referring to FIG. 4, the FPCB 2b includes a signal via pad 310, a core layer 330a, a top-side cover layer 340a, a bottom-side ground layer 350a, an isolation gap 360a, and a bottom-side cover layer 370b including a bottom-side dielectric material 400. Bottom-side cover layer 370b covers a bottom side of a lower portion of signal via pad 310, covers a bottom side of bottom-side ground layer 350a and fills isolation gap 360a. Dielectric material 400 of bottom-side cover layer 370b fills isolation gap 360a, covers the bottom side of the lower portion of signal via pad 310 and covers a portion of the bottom side of bottom-side ground layer 350a.

In the FPCB 2b, instead of filling the isolation gap 360a with the bottom-side cover layer 370b, the isolation gap 360a between the signal via pad 310 and the bottom-side ground layer 350a is filled with the bottom-side dielectric material 400 having a higher dielectric constant than the bottom-side cover layer 370b. The bottom-side dielectric material 400 may be a bonding material, for example, epoxy, which may enable a firm physical connection of the optical module and the FPCB 2b.

The top-side cover layer 340a and the bottom-side cover layer 370b, which are used in the FPCB 2b, may be made of the same material or different materials. Further, the FPCB 2b may be composed of a plurality of layers configured in a stack.

FIG. 5 is a diagram illustrating an FPCB according to a third exemplary embodiment.

Referring to FIG. 5, the FPCB 2c includes a signal via pad 310, a core layer 330b, a top-side cover layer 340b, a bottom-side ground layer 350b, a first isolation gap 1 360b, a second isolation gap 2 360c, a bottom-side cover layer 370c, a top-side ground layer 500a, and a ground via 510a.

When the signal lead pin 10 of the optical module is inserted through the through hole of the FPCB 2c, the signal lead pin 10 is cut to slightly protrude 300, and is soldered. In order to compensate for a parasitic inductance component caused by the protruding lead pin 300, the first isolation gap 360b is provided between the top-side ground layer 500a and the signal via pad 310 of the FPCB 2c, and the second isolation gap 360c is provided between the bottom-side ground layer 350b and the signal via pad 310, so as to induce a parasitic capacitance component. In this case, the first isolation gap 360b and the second isolation gap 360c, which are provided to induce a desired capacitance component, may be limited depending on conditions of manufacturing the FPCB, and there may be a case where the gap may not be reduced without limitation.

Referring to FIG. 5, instead of filling the first isolation gap 360b with air, the first isolation gap 360b is filled with the top-side cover layer 340b generally used for protection and electrical insulation when manufacturing the FPCB. Further, instead of filling the second isolation gap 360c with air, the second isolation gap 360c is filled with the bottom-side cover layer 370c generally used for protection and electrical insulation when manufacturing the FPCB. The top-side cover layer 340b and the bottom-side cover layer 370c have a higher dielectric constant than air.

The top-side cover layer 340b and the bottom-side cover layer 370c may be made of the same material or different materials. Further, the FPCB 2c may be composed of a plurality of layers configured in a stack. The first isolation gap 360b and the second isolation gap 360c may be different from each other. The ground via 510a connects the top-side ground layer 500a and the bottom-side ground layer 350b, and may be made of a conductive material.

The ground via 510a electrically connects the top-side ground layer 500a and the bottom-side ground layer 350b.

FIG. 6 is a diagram illustrating an FPCB according to a fourth exemplary embodiment.

Referring to FIG. 6, the FPCB 2d includes a signal via pad 310, a core layer 330b, a top-side cover layer 340c, a bottom-side ground layer 350c, a first isolation gap 1 360d, a second isolation gap 2 360e, a bottom-side cover layer 370d, a top-side ground layer 500b, a ground via 510b, a bottom-side dielectric material 600, and a top-side dielectric material 610.

In FIG. 6, the FPCB 2d includes: the top-side cover layer 340c formed on the top of the FPCB 2d; the top-side ground layer 500b formed on the bottom of the top-side cover layer 340c; the bottom-side ground layer 350c connected with the top-side ground layer 500b through the ground via 510b; the signal via pad 310 having an upper portion spaced apart from the top-side ground layer 500b, and a lower portion spaced apart from the bottom-side ground layer 350c; the bottom-side cover layer 370d formed on the bottom of the bottom-side ground layer 350c; the first isolation gap 360d interposed between the top-side ground layer 500b and the upper portion of the signal via pad 310; and the second isolation gap 360e interposed between the bottom-side ground layer 350c and the lower portion of the signal via pad 310.

In the FPCB 2d, the first isolation gap 360d is provided between the top-side ground layer 500b and an upper portion of the signal via pad 310; and the second isolation gap 360e is provided between the bottom-side ground layer 350c and a lower portion of the signal via pad 310. In this case, instead of filling the first isolation gap 360d with the top-side cover layer 340c, the first isolation gap 360d is filled with the top-side dielectric material 610 having a higher dielectric constant than a material of the top-side cover layer 340c. Further, instead of filling the second isolation gap 360e with the bottom-side cover layer 370d, the second isolation gap 360e is filled with the bottom-side dielectric material 600 having a higher dielectric constant than a material of the bottom-side cover layer 370d. The dielectric material may be a dielectric function material, or may be a bonding material, such as epoxy, used for a firm physical connection between the optical module and the FPCB 2d. The bottom-side dielectric material 600 and the top-side dielectric material 610 may be configured in different manners from each other.

In the FPCB, the first isolation gap 360d and the second isolation gap 360e may be configured in different manners as follows. For example, the first isolation gap 360d may be filled with air, and the second isolation gap 360e may be filled with the bottom-side dielectric material 600. Alternatively, the first isolation gap 360d may be filled with the same material as the material of the top-side cover layer 340c, and the second isolation gap 360e may be filled with the bottom-side dielectric material 600. In addition, the first isolation gap 360d may be filled with air, and the second isolation gap 360e may be filled with the same material as the material of the bottom-side cover layer 370d. Moreover, the first isolation gap 360d may be filled with the same material as the material of the top-side cover layer 340c, and the second isolation gap 360e may be filled with air. Further, the first isolation gap 360d may be filled with the top-side dielectric material 610, and the second isolation gap 360e may be filled with air. In the above examples, either one of the first isolation gap 360d and the second isolation gap 360e is filled with a material of the cover layer or a dielectric material. However, such examples are merely illustrative, and the first and the second isolation gaps may be configured in various other manners.

Figure 7:
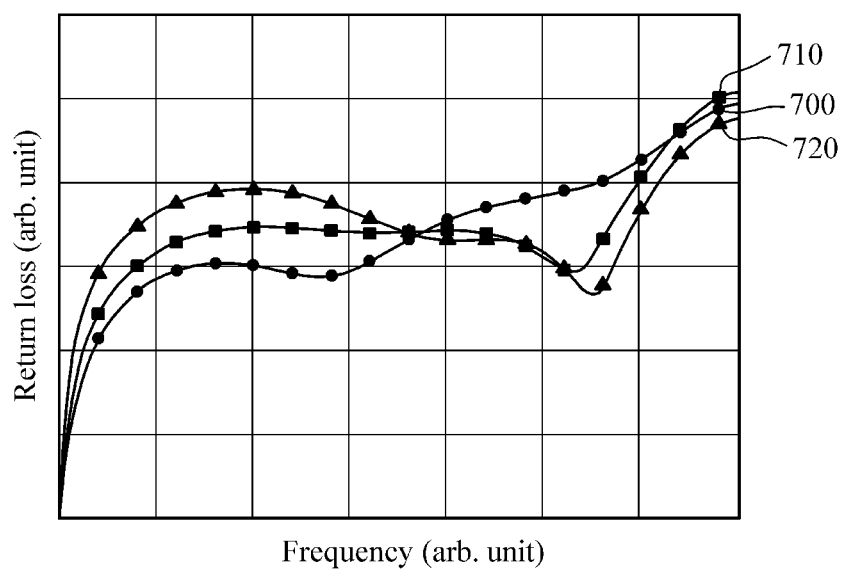
FIG. 7 is a graph illustrating a return loss according to a frequency of an FPCB according to an exemplary embodiment.

FIG. 7 is a graph illustrating a return loss according to a frequency of an FPCB according to an exemplary embodiment.

Referring to FIG. 7, return loss values may be obtained for the following cases: a case where an isolation gap between the bottom-side ground layer and the signal via pad is filled with air (dielectric constant=1) in 700; a case where an isolation gap between the bottom-side ground layer and the signal via pad is filled with the bottom-side cover layer (dielectric constant=3.4) in 710; and a case where an isolation gap between the bottom-side ground layer and the signal via pad is filled with a bonding material (epoxy with a dielectric constant=6) in 720. The dielectric material (filling material) used in the calculation is merely an example for the convenience of explanation, and the present disclosure is not limited thereto. By adjusting resonance points on the return loss curve according to filling materials having different dielectric constants, a return loss may be induced to a specific value in a desired frequency range or less.

Figure 8:
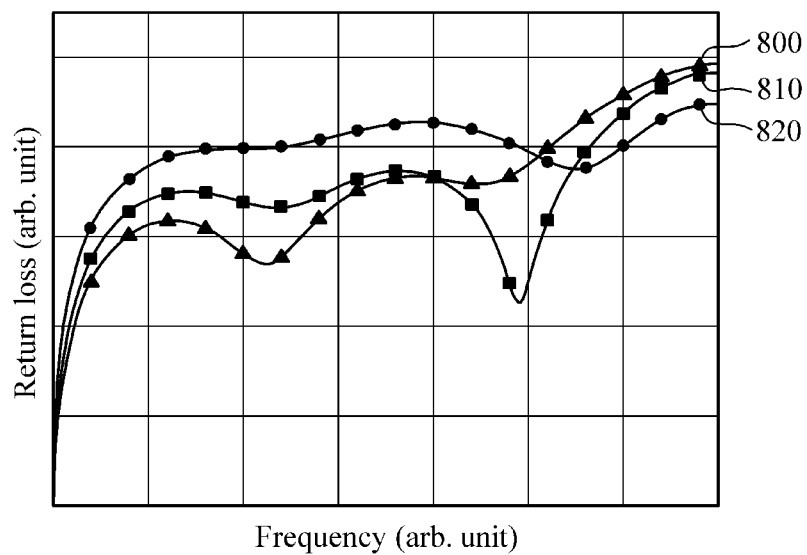
FIG. 8 is a graph illustrating a return loss according to a frequency of an FPCB according to another exemplary embodiment.

FIG. 8 is a graph illustrating a return loss according to a frequency of an FPCB according to another exemplary embodiment.

Referring to FIG. 8, return loss values may be obtained for the following cases: a case where a first isolation gap 1 between the top-side ground layer and the signal via pad and a second isolation gap 2 between the bottom-side ground layer and the signal via pad are filled with air (dielectric constant=1) in 800; a case where the first isolation gap 1 and the second isolation gap 2 are filled with the top-side cover layer (dielectric constant=3.4) and the bottom-side cover layer (dielectric constant=3.4) respectively in 810; and a case where the first isolation gap 1 and the second isolation gap 2 are filled with a bonding material (epoxy with a dielectric constant=6) in 820.

Referring to FIG. 8, it can be seen that the same material was used as a bonding material in 820 to fill the first isolation gap 1 and the second isolation gap 2. The dielectric material (filling material) used in the calculation is merely an example for the convenience of explanation, and the present disclosure is not limited thereto. By adjusting resonance points on the return loss curve according to filling materials having different dielectric constants, a return loss may be induced to a specific value in a desired frequency range or less.

According to the present disclosure, when a signal lead pin of an optical module is connected with a flexible printed circuit board ("FPCB"), the signal lead pin is cut to protrude, thereby compensating for unintentional parasitic inductance. That is, by providing an isolation gap between a signal via pad of the FPCB and a ground layer that surrounds the FPCB, and by filling the isolation gap with a coating material used for manufacturing the FPCB or a dielectric material having a dielectric constant, a parasitic inductance component may be compensated for, and a desired capacitance component may be readily induced. Further, By using a bonding material, such as epoxy, as a dielectric material, a firm connection between the optical module and the FPCB may be maintained.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims. Further, the above-described examples are for illustrative explanation of the present invention, and thus, the present invention is not limited thereto.

What is claimed is:

1. A flexible printed circuit board (FPCB) for an optical module, the FPCB comprising:
   a signal via pad connected with a signal lead pin of the optical module;
   a bottom-side ground layer spaced apart from a lower portion of the signal via pad;
   a first isolation gap formed between lower portion of the signal via pad and the bottom-side ground layer; and
   a protective layer comprising a first cover layer covering a bottom side of the lower portion of the signal via pad, covering a bottom side of the bottom-side ground layer, filling the first isolation gap, and that compensates for, parasitic inductance caused by a protruding signal lead pin.

2. The FPCB of claim 1, wherein the protective layer induces a capacitance component in the first isolation gap to compensate for the parasitic inductance caused by the protruding signal lead pin.

3. The FPCB of claim 1, wherein the protective layer has a higher dielectric constant than air.

4. The FPCB of claim 1, wherein the protective layer is a cover layer filled with a coating material.

5. The FPCB of claim 1, wherein the protective layer is filled with a dielectric material.

6. The FPCB of claim 1, wherein the dielectric material is a bonding material.

7. The FPCB of claim 1, wherein the FPCB comprises: a top-side ground layer spaced apart from an upper portion of the signal via pad and a second isolation gap formed between the upper portion of the signal via pad and the top-side ground layer, and
   wherein the protective layer comprises: a second cover layer covering a top side of the upper portion of the signal via pad, covering a top side of the top-side ground layer, and filling the second isolation gap.

8. The FPCB of claim 7, wherein the first isolation gap and the second isolation gap are identical to or different from each other.

9. The FPCB of claim 7, wherein:
   the first cover layer comprises a first coating material; and
   the second cover layer comprises a second coating material,
   wherein the first coating material and the second coating material are identical to or different from each other.

10. The FPCB of claim 7, wherein:
    the first cover layer is filled with a first dielectric material; and
    the second cover layer is filled with a second dielectric material, wherein the first dielectric material and the second dielectric material are identical to or different from each other.

\* \* \* \* \*